(12) United States Patent
Benthien et al.

(10) Patent No.: US 10,854,909 B2
(45) Date of Patent: Dec. 1, 2020

(54) SKIN PANEL WITH AN ENERGY-STORING LAYER FOR AN AIRCRAFT OR SPACECRAFT AND METHOD FOR MANUFACTURING AN ENERGY-STORING LAYER FOR A SKIN PANEL

(71) Applicant: AIRBUS OPERATIONS GMBH, Hamburg (DE)

(72) Inventors: Hermann Benthien, Hamburg (DE); Peter Linde, Hamburg (DE); Matthias Hegenbart, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 629 days.

(21) Appl. No.: 15/463,283

(22) Filed: Mar. 20, 2017

(65) Prior Publication Data
US 2017/0271711 A1     Sep. 21, 2017

(30) Foreign Application Priority Data

Mar. 21, 2016 (EP) .................................... 16161416

(51) Int. Cl.
*B64C 1/12*     (2006.01)
*H01M 10/0525*  (2010.01)
(Continued)

(52) U.S. Cl.
CPC .......... *H01M 10/0525* (2013.01); *B64C 1/12* (2013.01); *B64C 3/26* (2013.01); *H01L 41/193* (2013.01);
(Continued)

(58) Field of Classification Search
CPC ....... B64C 1/12; B64C 3/26; B64C 2201/042; B64C 2221/00; B64C 2211/00
See application file for complete search history.

(56) References Cited

U.S. PATENT DOCUMENTS 4,234,245 A * 11/1980 Toda ....................... G09F 9/372
                                                            359/230
4,768,738 A *  9/1988 Weinert .................. B64C 25/10
                                                            244/53 R
(Continued)

FOREIGN PATENT DOCUMENTS

WO     WO 2011/098795 A1     8/2011
WO     WO-2011098795 A1 *    8/2011    ........ H01M 10/0525
(Continued)

OTHER PUBLICATIONS

European Search Report for Application No. 16161416 dated Oct. 20, 2016.
(Continued)

*Primary Examiner* — Philip J Bonzell
(74) *Attorney, Agent, or Firm* — Jenkins, Wilson, Taylor & Hunt, P.A.

(57) ABSTRACT

A skin panel with an energy-storing layer for an aircraft or spacecraft comprises structural layers for providing structural stability to the skin panel, at least one of the structural layers forming an exterior supporting layer of the skin panel and at least one of the structural layers forming an interior supporting layer of the skin panel. Primary functional layers are embedded between the exterior supporting layer and the interior supporting layer for providing functional capabilities to the skin panel. The structural layers and the primary functional layers are formed together as a composite laminate and the functional layers comprise an energy-storing layer configured as a structural electro-chemical battery. The present disclosure further pertains to a method for manufacturing such an energy-storing layer for a skin panel of an aircraft or spacecraft.

17 Claims, 2 Drawing Sheets

(51) Int. Cl.
*H01M 4/13* (2010.01)
*H01M 4/66* (2006.01)
*H01L 41/193* (2006.01)
*B64C 3/26* (2006.01)
*H01M 4/04* (2006.01)
*H01M 10/0585* (2010.01)
*H01M 4/62* (2006.01)

(52) U.S. Cl.
CPC ........... *H01M 4/0402* (2013.01); *H01M 4/13* (2013.01); *H01M 4/661* (2013.01); *H01M 10/0585* (2013.01); *B64D 2221/00* (2013.01); *H01M 4/625* (2013.01); *H01M 2220/20* (2013.01); *Y02E 60/10* (2013.01); *Y02P 70/50* (2015.11)

(56) References Cited

U.S. PATENT DOCUMENTS

| | | | | |
|---|---|---|---|---|
| 7,150,938 | B2 * | 12/2006 | Munshi | H02J 7/35 429/162 |
| 7,829,796 | B2 | 11/2010 | Feider et al. | |
| 7,883,050 | B2 | 2/2011 | Dufresne et al. | |
| 8,704,078 | B2 * | 4/2014 | Huang | H01L 31/052 136/244 |
| 9,136,563 | B2 * | 9/2015 | Hucker | H01M 10/30 |
| 9,180,977 | B2 * | 11/2015 | Gatzke | B64D 41/00 |
| 9,318,625 | B2 * | 4/2016 | Gatzke | B64D 41/00 |
| 9,694,894 | B2 * | 7/2017 | Deakin | B64B 1/08 |
| 9,994,313 | B2 * | 6/2018 | Claridge | B64C 29/02 |
| 2003/0038610 | A1 * | 2/2003 | Munshi | H02J 7/35 320/101 |
| 2009/0047453 | A1 * | 2/2009 | Folaron | B32B 37/18 428/34.1 |
| 2012/0308887 | A1 * | 12/2012 | Hucker | H01M 4/621 429/211 |
| 2012/0318915 | A1 * | 12/2012 | Gatzke | H02S 40/36 244/58 |
| 2013/0002015 | A1 * | 1/2013 | Gatzke | B64D 41/00 307/9.1 |
| 2013/0059173 | A1 * | 3/2013 | Hucker | H01M 10/0585 429/9 |
| 2013/0062457 | A1 * | 3/2013 | Deakin | B64B 1/08 244/25 |
| 2013/0089735 | A1 * | 4/2013 | Kim | B05D 1/18 428/367 |
| 2013/0209839 | A1 * | 8/2013 | Hucker | H01M 4/624 429/9 |
| 2014/0339356 | A1 * | 11/2014 | Deakin | B64B 1/08 244/25 |
| 2016/0144957 | A1 * | 5/2016 | Claridge | B64C 29/02 244/6 |
| 2017/0327219 | A1 * | 11/2017 | Alber | B64D 27/24 |
| 2018/0290744 | A1 * | 10/2018 | Claridge | B64C 29/02 |
| 2019/0135428 | A1 * | 5/2019 | Claridge | B64C 29/02 |

FOREIGN PATENT DOCUMENTS

| | | |
|---|---|---|
| WO | WO 2014/021970 A2 | 2/2014 |
| WO | WO-2014021970 A3 * | 4/2014 |
| WO | WO 2015/116265 A1 | 8/2015 |

OTHER PUBLICATIONS

European Search Report for Application No. 16161416.9 dated Jan. 23, 2017.

* cited by examiner

SKIN PANEL WITH AN ENERGY-STORING LAYER FOR AN AIRCRAFT OR SPACECRAFT AND METHOD FOR MANUFACTURING AN ENERGY-STORING LAYER FOR A SKIN PANEL

CROSS-REFERENCE TO RELATED APPLICATION

This patent application claims priority to European Patent Application EP 16 161 416.9 filed Mar. 21, 2016, the entire disclosure of which is incorporated by reference herein.

TECHNICAL FIELD

The present disclosure pertains to a skin panel with an energy-storing layer for an aircraft or spacecraft and a method for manufacturing an energy-storing layer for a skin panel.

Although generally applicable to any kind of aircraft or spacecraft, the present disclosure and the problem on which it is based will be explained in greater detail with reference to passenger aircraft.

BACKGROUND

The fuselage and the wings of a modern passenger airplane comprise a rigid framework of stiffening elements, like for example stringers, frames, rips, spars, etc., being covered by a metal or composite skin, which may be configured flexible or stiff depending on the specific requirements. For example, the fuselage framework usually comprises a series of frames bent into a circumferential direction according to the shape of the fuselage cross section and a plurality of longitudinal stringers or longerons that are joined to the frames. The skin itself usually consists of many individual skin panels that are typically fixed to this underlying structural framework by rivets, bolts, screws, and other fasteners, and may be formed from metal sheets or metal alloy sheets, e.g. aluminum sheets, from a fiber metal laminate, e.g. glass laminate aluminum reinforced epoxy (GLARE®), or from a fiber reinforced plastic, e.g. carbon fiber reinforced plastic (CFRP) with an epoxy resin matrix, or the like. It is common to all these applications that the aircraft skin is mainly optimized to fulfill basic structural and aerodynamic purposes including general protection against heat, pressure, lightning and so on, the provision of structural strength, drag reduction, as well as the transfer of aerodynamic forces, loads, and pressures to the underlying structure.

Composite materials like CFRP have been increasingly used in aerospace applications as they allow designers to improve structural performance while reducing aircraft weight and, hence, fuel consumption. Recent advanced tape laying, fiber placement and additive manufacturing techniques for the manufacture of composite lay-up materials provide a vast source of yet untapped potential for improving the skin structure and for implementing structural and functional elements directly into the skin of an aircraft, which otherwise would necessarily require elaborate installation efforts or would not be possible at all. For example, documents U.S. Pat. No. 7,883,050 B2 and U.S. Pat. No. 7,829,796 B2 teach multi-layer lightning protection systems for the skin of an aircraft, while document WO 2015/116265 A1 discloses a multi-layer de-icing skin for aircraft.

SUMMARY

It is one idea of the present disclosure to to integrate an energy source into an aircraft or spacecraft skin for powering electrically-operated functionalities while maintaining structural integrity of the skin.

According to a first aspect of the disclosure herein, a skin panel with an energy-storing layer for an aircraft or spacecraft comprises structural layers for providing structural stability to the skin panel, at least one of the structural layers forming an exterior supporting layer of the skin panel and at least one of the structural layers forming an interior supporting layer of the skin panel, and primary functional layers embedded between the exterior supporting layer and the interior supporting layer for providing functional capabilities to the skin panel. The structural layers and the primary functional layers are formed together as a composite laminate. The functional layers comprise an energy-storing layer configured as a structural electro-chemical battery.

According to a second aspect of the disclosure herein, an aircraft or spacecraft comprises a functional skin with a plurality of skin panels according to the first aspect of the disclosure herein.

According to a third aspect of the disclosure herein, a method for manufacturing an energy-storing layer for a skin panel of an aircraft or spacecraft, wherein the energy-storing layer is configured as an electro-chemical battery, comprises supplying a spread tow tape containing a plurality of reinforcing carbon fibers from a tape supply to a merging station. The method further comprises supplying a plurality of ion-enriched matrix-material filaments from a multi-filament supply to the merging station. The ion-enriched matrix-material filaments in particular may be epoxy-resin filaments. The method further comprises pressing together the plurality of ion-enriched matrix-material filaments with the spread tow tape at the merging station. The method further comprises heating the spread tow tape together with the plurality of ion-enriched matrix-material filaments at the merging station to a melting temperature of the ion-enriched matrix-material filaments to form an anode layer of the electro-chemical battery. The method further comprises depositing the anode layer of the electro-chemical battery. The method further comprises supplying a metal fabric from a fabric supply to the merging station. The metal fabric may particularly comprise copper mesh. The method further comprises supplying a plurality of matrix-material filaments from the multi-filament supply to the merging station. The matrix-material filaments in particular may be epoxy-resin filaments. The method further comprises pressing together the plurality of matrix-material filaments with the metal fabric at the merging station. The method further comprises heating the metal fabric together with the plurality of matrix-material filaments at the merging station to a melting temperature of the matrix-material filaments to form a cathode layer of the electro-chemical battery. The method further comprises depositing the cathode layer of the electro-chemical battery.

One idea of the present disclosure is to provide a layered composite skin panel with an "embedding" supporting structure and an "embedded" functional structure, into which a structural battery is integrated that provides electrical power for operating electric devices inside or outside of the skin. The supporting structure may provide the skin panel with the required rigidity and stiffness such that the skin may fulfill the same structural requirements as conventional skins. In particular, the supporting layers may provide load carrying capabilities as these are able to carry tension and/or compression loads. At the same time, internal layers of the composite skin panel incorporate a structural battery as functional layer and, possibly, further functional aspects. Structurally, these primary functional layers may also be optimized to carry shear loads acting between the supporting layers and the functional layers. The electro-chemical battery on the other hand is part of the structure of the aircraft or spacecraft skin and in this sense is seemingly integrated into the skin. The structural battery according to the disclosure herein may be a carbon fiber fabric saturated with matrix material and intercalated with ions forming an electrode that may provide strength as well as conductivity. The person of skill will readily acknowledge that generally— depending on the specific application—a certain trade-off has to be chosen between strength on the one hand and conductivity on the other hand. However, carbon fibers comprising carbon nanotubes may be advantageous for certain high performance applications as these may provide high electrical conductivity and high strength at the same time. In addition, carbon nanotube fibers may be provided in extremely small geometries. As the surface area of a typical aircraft skin is very large, the skin panel according to the disclosure herein may potentially store a significant amount of electrical energy, which may be tapped in order to operate various electric devices within the skin or outside of the skin, e.g. in the aircraft interior, like the passenger cabin, the cockpit, or the cargo bay. To this end, the primary functional layers of the function skin may be electrically interconnected with the aircraft interior through the interior support layer and any other layer situated in between by provisions known to the person of skill. In principle, the teachings of the present disclosure may thus enable electric flight. Further, the present disclosure advantageously combines structural optimization with functional opportunities within one composite skin laminate. The teachings of the present disclosure may be employed for fuselage skin panels as well as for wing skin panels or similar.

Furthermore, the present disclosure offers a precise, yet very efficient and convenient as well as cost-sensitive method to fabricate such composite skins in a lightweight and yet structurally strong configuration. This is particularly relevant in case of the very large skin areas arising in aerospace engineering. One particularly advantageous aspect of the present method is to utilize spread tow tapes within an additive manufacturing method. Using spread tow tapes a flat, thin material layer comprising many individual fibers may be automatically and fully autonomously applied in one process step. Specifically, a spread tow tape comprising a plurality of reinforcing fibers may be merged with a plurality of matrix material filaments to form one electrode layer of the electro-chemical battery. This opens up the possibility to provide a high-qualitative fast layup process, e.g. considered in deposited material per time (for example, expressed as deposited areal weight per second or covered material layer per second), as spread tow tapes of dry fibers may be feed at high speed. To this end, the matrix material filaments may be processed at exactly the same speed as the spread tow tape.

Spread tow tapes are fabricated by spreading tows of desired dry fiber type into flat unidirectional (UD) tapes of certain areal weight and width by using mechanical or electromagnetic spreading techniques. The spreading of tows enables producing UD tapes of very low areal weight and very thin width while maintaining consistency of width. In principle, these tapes may be processed further by interlacing tapes of desired fibers to obtain a fabric with straight orientation of fibers, e.g. in the sense of a cross plied UD tape. As a result, one arrives at spread tow tapes that may serve as a reinforcement with the mechanical performance of conventional cross plied UD lay ups and the ease of handling of a fabric. Spread tow tapes within the meaning of the disclosure herein generally comprise tapes of spread fiber tows and, thus, include UD spread tows as well as spread tow fabrics from interlaced spread tows. Spread tow tapes are extremely suitable as fiber reinforcements as they can be accessed and submerged fully with resin. To this end, the present disclosure provides matrix material filaments, e.g. made of an epoxy resin or another suitable material, which are pressed against the spread tow tape and merged with it in viscous form by melting the matrix material filaments.

The additive manufacturing method according to the disclosure herein may be combined with or used as an alternative to more conventional automated fiber placement (AFP) or automated tape laying (ATL). AFP machines are a recent development of composite manufacturing technologies meant to increase rate and precision in the production of advanced composite parts. APF machines place fiber reinforcements on molds or mandrels in an automatic fashion and use a number of separate small width tows of thermoset or thermoplastic pre-impregnated materials to form composite layups. However, this method typically does not reach the same deposition rates of ATL machines. For example, the energy-storing layer according to the disclosure herein may be additively manufactured according to the method of the disclosure herein, while the structural layers of the skin panel may be deposited with conventional layup processes. Alternatively, also the structural layers may be placed in a similar vain to the energy-storing layer by supplying tapes of reinforcing fiber material, e.g. comprising carbon fibers or carbon nanotube fibers, and merging this with matrix material filaments to fiber reinforced composite material plies, which are subsequently deposited. The skin panel according to the disclosure herein may furthermore be provided with an electro-chemical battery comprising a plurality of individual electro-chemical battery cells, each of which may comprise an anode layer and a cathode layer according to the disclosure herein, the individual cells being stacked upon another and connected to each other in series.

According to an embodiment of the disclosure herein, the energy-storing layer may be configured as a lithium-ion battery. In principle however, also other technologies and material combinations known for structural batteries or layered batteries may be employed within the disclosure herein instead of lithium-based technologies.

According to an embodiment of the disclosure herein, the energy-storing layer may include an anode layer comprising carbon fibers embedded within an ion enriched matrix material. The energy-storing layer may further include a cathode layer comprising a metal fabric embedded within the matrix material. The carbon fibers may comprise carbon nanotube fibers or other carbon allotropes with a basic graphene-like structure. Carbon nanotubes provide several advantages, among them high conductivity, high strength and the possibility to manufacture transparent functional layers with high strength and conductivity. Transistors fashioned out of carbon nanotubes may be configured much smaller than conventional silicon-based transistors such that thin and flexible electric circuit layers may be provided on this basis that may provide various functionalities to a layered aircraft skin.

The carbon fibers may be embedded within a lithium-ion enriched matrix material. The metal fabric may comprise a copper mesh or other metal mesh or metal alloy mesh. The term mesh within the disclosure herein refers to a surface-like structure with a plurality of openings that cover a significant part of the surface-like structure. The term mesh, as taken in the sense of the disclosure herein, also includes grids, gratings, surface-like lattice structures or the like. The matrix material may comprise an epoxy resin or similar, e.g. a thermoplastic. Instead of a metal fabric, it may be advantageous to disperse metal particles within an epoxy resin to form the cathode layer of the energy-storing layer. The person of skill will be aware that many alternative configurations of anode layers and cathode layers may be provided to realize a structural electro-chemical battery.

According to an embodiment of the disclosure herein, at least the exterior supporting layer may be configured visually transparent. The primary functional layers may comprise an energy-harvesting layer configured as a photovoltaic module. The photovoltaic module may be configured and arranged to generate electric energy based on light being transmitted through the exterior supporting layer onto the energy-harvesting layer and to charge the energy-storing layer with the generated electric energy. In this embodiment, the skin panel is thus configured as a self-sustaining skin structure for an aircraft that may produce and store electric energy to power various electric devices within the skin panel or within the aircraft. Photovoltaic modules including one or many photovoltaic cells may be provided in very thin planar configurations. For example, polymeric organic solar cells typically have a very low thickness and may be manufactured with very large active surface areas. Supporting layers of high strength that are nevertheless transparent (at least in portions) may be provided for example on the basis of carbon nanotube fibers or other graphene structures. Even the photovoltaic module itself may be provided in a visually transparent configuration. Particularly, single-walled carbon nanotubes may be used in solar panels due to their strong absorption characteristics with respect to the visual, ultraviolet and near infrared spectrum. Such photovoltaic modules may be manufactured with additive manufacturing or 3D-printing methods. Hence, such an energy-harvesting layer may be implemented within one single integrated continuous additive manufacturing process, in which some or all of the primary functional layers of the skin panel, i.e. an energy-storing layer, an energy-harvesting layer, an electric-actuator layer and so on, are deposited and configured. The different primary functional layers as well as the structural layers may be separated or isolated from each other by dedicated isolation layers implemented into the skin panel. In principle, the skin panel according to the disclosure herein may also comprise more than two structural layers, i.e. not only one exterior supporting layer and one interior supporting layer but also additional supporting layers or structural layers, e.g. interspersed within the functional layers to provide additional structural support to the skin panel. For example, "active" structural battery layers or battery cell layers may be interspersed with "inert" carbon composite layers.

According to an embodiment of the disclosure herein, the primary functional layers may comprise an electric-actuator layer configured to bend when exposed to an electric field. The electric-actuator layer may be electrically powered by the energy-storing layer. Such an electric-actuator layer may for example comprise an ionic polymer-metal composite layer or similar that bends when exposed to an electric field and thus may serve as an "artificial muscle". To this end, the ionic polymer-metal composite layer may be embedded within an electrode network or grid with a cathode layer on one side and an anode layer on the other side, which are configured to generate a variable electric field across the ionic polymer-metal composite layer. Based on such technologies, active morphing structures and adaptronic structures, e.g. for aircraft wings, may be realized. Also in this case, the exceptional electrical and mechanical properties of carbon nanotubes may open up the possibilities to replace traditional electric actuators with carbon nanotube based actuators.

The electric-actuator layer may comprise an electro-active polymer layer. The electric-actuator layer may further comprise a plurality of electrodes configured to generate an electric field across the electro-active polymer layer. Example of electro-active polymer layers comprise dielectric electro-active polymers, ionic electro-active polymers, e.g. ionic polymer-metal composites, but also highly advanced Bucky gel actuators including a polymer-supported layer of polyelectrolyte material comprising an ionic liquid sandwiched between two electrode layers consisting of or comprising a gel of ionic liquid containing carbon nanotubes.

According to an embodiment of the disclosure herein, the primary functional layers may comprise a structural-health-monitoring layer. The structural-health-monitoring layer may include structural sensors configured to monitor structural-health parameters of the skin panel. The structural sensors may be electrically powered by the energy-storing layer. The structural sensors may comprise, for example, low noise electronic sensors in the form of sensors, detectors, or antennas or similar that are implemented into the skin panel, examples comprising acceleration sensors or piezoelectric transducers. Acceleration sensors may be for example distributed over the skin panel in a web-like configuration. When an object hits the aircraft in the vicinity of one of such sensors, the respective sensor will detect the shock from the impact and may provide an estimation of the impact location, as well as possibly the affected area and/or the strength of the impact. Piezoelectric transducers may for example be placed within the skin panel for evaluating impact damage on the skin panel by actuating and sensing elastic wave propagation in the skin panel. While propagating through the material, these waves are affected by discontinuities in the material, like for example ruptures, deformations or displacements caused by an impact or fatigue. Hence, the propagation is affected in a very specific way and the changes in the propagated wave spectrum can be measured and analyzed to evaluate if damage occurred or not. In this way, any possible damage on the fuselage or the wings of an aircraft may be detected and assessed electronically.

According to an embodiment of the disclosure herein, at least one of the exterior supporting layer and the interior supporting layer may be formed from a fiber reinforced composite material comprising carbon nanotube fibers embedded within a matrix material. Filaments and fibers with carbon nanotubes are commercially available and hence may be embedded within additive manufacturing methods or similar into a matrix of a plastic material, like an epoxy resin or similar. The skin panel may hence be configured with a supporting structure of high stability and strength (due to the nanotubes) and a functional core that is storing and/or producing electric energy for powering various functionalities.

The carbon nanotube fibers may be arranged in the form of a mesh. The mesh may substantially cover the skin panel. In this embodiment, the interior supporting layer and/or the exterior supporting layer may be provided with a mesh of highly-conductive carbon nanotube fibers or similar. This provision may replace conventional lightning protection layers as they are usually provided for aircraft or spacecraft with a composite structure and skin. Typical common CFRP composites do not conduct electric current sufficiently so that in contrast to aircraft with metallic structures a dedicated lightning protection layer needs to be implemented, typically a mesh of copper or copper alloy or another adequate metal material. A skin panel with one or several structural layers comprising a mesh of carbon nanotubes would make such a conventional lightning protection system dispensable.

According to an embodiment of the disclosure herein, the skin panel may further comprise secondary functional layers including at least one of an exterior secondary functional layer abutting the exterior supporting layer from the outside and an interior secondary functional layer abutting the interior supporting layer from the inside. Hence, the skin panel may provide additional functional layers outside or inside of the general structural portion of the skin, i.e. the exterior supporting layer and the interior supporting layer.

The interior secondary functional layer may comprise at least one of an electrical connector, an electronic display, an electronic interface and a computing device and similar, being electrically powered by the energy-storing layer. In embodiments, the electrical connectors and/or the electronic interfaces may be connected to certain functional layers of the skin panel. For example, the energy-storing layer as well an energy-harvesting layer may be connected to the inside of the aircraft, e.g. to aircraft electronics within the passenger cabin, the cockpit, the cargo bay, etc. Furthermore, the electronic interfaces may be configured to provide the access of a user to specific functions of the functional layers for configuration, maintenance, or monitoring purposes. The electronic interfaces may connect the functional layers to electronic devices within the aircraft or provided in or on the interior secondary functional layer. For example, flexible displays, touchscreens or similar may be provided in the interior secondary functional layer to display and process information for configuration and monitoring of specific functionalities of the functional layers of the skin panel. Based on modern additive manufacturing techniques even flexible and very thin electronics, like electronic circuits, sheet displays, bendable touchscreens, super capacitors etc., may be provided within a functional layer.

The exterior secondary functional layer may be configured as a protection layer for protecting the skin panel. Such a protection may comprise a coating or similar, which may be transparent or semi-transparent in portions. However, also more advanced protection layers may be provided within the disclosure herein including, but not limited to, energy and/or radiation shielding, radar absorption etc.

According to an embodiment of the method, the ion-enriched matrix-material filaments may be enriched with lithium-ions by application of a lithium ion-solvent. In one example, the lithium ion-solvent may for example be applied to the matrix-material filaments directly at the multi-filament supply, which may be for example a single spool or a group of spools of individual or multiple filaments.

According to an embodiment of the method, the spread tow tapes may be surface pretreated for ion reception with at least one of a mechanical surface treatment, a laser surface treatment and a chemical surface treatment. The pre-treatment may be particular chosen by the person of skill to make the surface of the spread two tapes receptive for charged lithium ions.

According to an embodiment of the method, the spread tow tape and/or the metal fabric may be heated together with the plurality of matrix material filaments and/or ion-enriched matrix material filaments by a laser beam. Accordingly, the respective additive manufacturing device may comprise a laser configured and arranged to transmit a laser beam onto the spread tow tape and/or the metal fabric and the plurality of matrix material filaments within the merging station to heat the spread tow tape and/or the metal fabric and the plurality of matrix material filaments. Hence, in this embodiment, the matrix material filaments may be melted in a very cost-efficient and controlled manner, as the temperature may be steered precisely with the laser.

According to an embodiment of the method, the plurality of matrix material filaments and/or ion-enriched matrix material filaments may be pressed together with the spread tow tape and/or the metal fabric between two pressing plates configured and arranged to press together the plurality of matrix material filaments with the spread tow tape and/or the metal fabric within the merging station. The two pressing plates thus form a kind of tunnel to guide and feed the matrix material filaments together with the spread tow tape/the metal fabric and to press these together in a controlled manner.

According to an embodiment of the method, the laser beam may be transmitted by passing through at least one of the two pressing plates. To this end, the pressing plates may be formed transparently to transmit the laser beam. For example, one or both pressing plates may be formed from a transparent glass or glass-like material, through which a laser beam is able to pass. Hence, the two pressing plates define a space between them where the matrix material filaments are pressed together with the spread tow tape and/or the metal fabric and where both are heated up in order to merge them together.

According to an embodiment of the method, the anode layer and/or the cathode layer may be deposited by pressing them down with an ironing device. The ironing device may particularly be configured to heat up such that the anode layer and/or cathode layer is pressed against a manufacturing table and/or already deposited material in a molten or fluid or semi-fluid condition. This allows a smooth, unbroken buildup of a layup without any gaps, voids or cavities or the like.

According to an embodiment of the method, the anode layer and/or the cathode layer may be cut off above or at the ironing device with a cutting device.

The embodiments and developments above can, where appropriate, be combined with one another as desired. Further possible embodiments, developments and implementations of the disclosure herein also include not explicitly mentioned combinations of features of the disclosure herein described above or in the following with reference to the embodiments. In particular, in this case, a person skilled in the art will also add individual aspects as improvements or supplements to the respective basic forms of the present disclosure.

BRIEF DESCRIPTION OF THE DRAWINGS

In the following, the present disclosure will be described in more detail with reference to the embodiments represented in the schematic figures, in which.

Figure 1A:
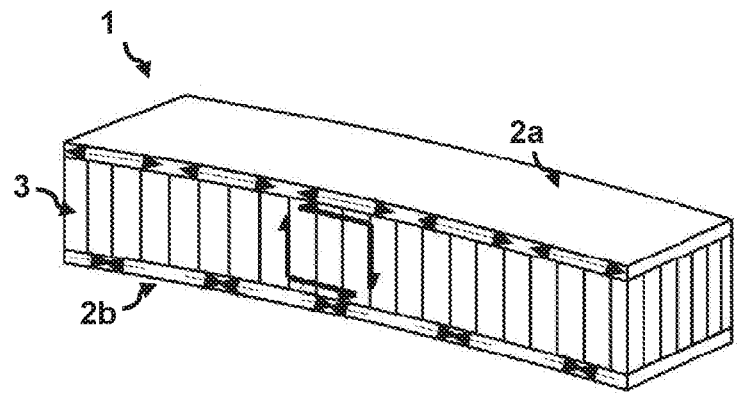
FIGS. 1a and 1b schematically illustrate a skin panel with an energy-storing layer for an aircraft according to an embodiment of the disclosure herein (in perspective view in FIG. 1a and in cross-sectional view in FIG. 1b).

The accompanying figures are to provide a further understanding of the embodiments of the disclosure herein. They illustrate embodiments and, together with the description, serve to explain the principles and concepts of the disclosure herein. Other embodiments and many of the mentioned advantages are revealed in view of the drawings. The elements of the drawings have not necessarily been drawn true-to-scale relative to one another.

In the figures of the drawings, identical, functionally identical and identically acting elements, features and components have been respectively provided with the same reference numerals, unless indicated otherwise.

DETAILED DESCRIPTION

Figure 1B:
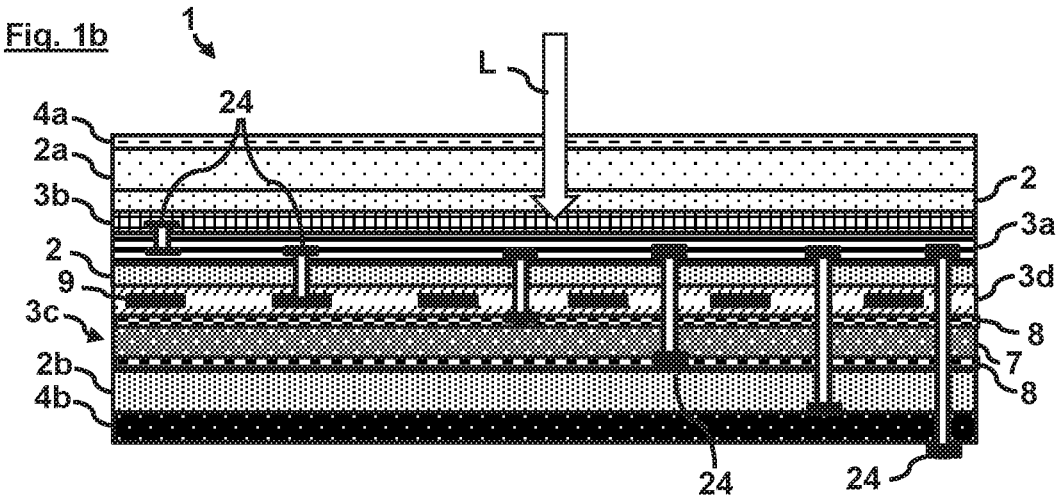

With reference to FIGS. 1a and 1b of the drawings, a skin panel 1 for an aircraft 100 according to an embodiment of the disclosure herein is shown. FIG. 1a depicts the skin panel 1 in perspective view, while FIG. 1b shows the skin panel 1 in a cross-sectional view.

Figure 4:
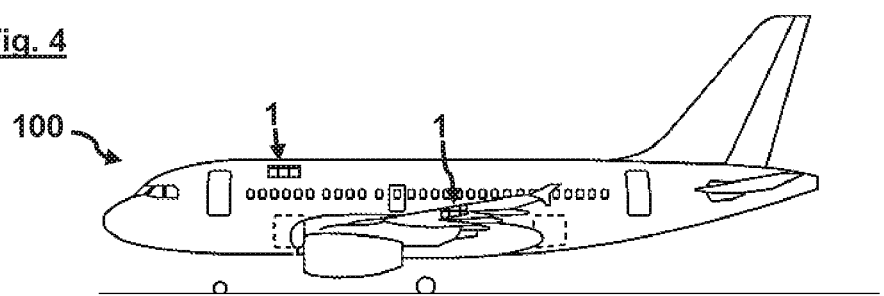
FIG. 4 shows a schematic aircraft comprising skin panels with the skin panel of FIGS. 1a and 1b.

The skin panel 1 may be part of the skin of an aircraft 100 as depicted in FIG. 4 and may be fixed to the underlying structural framework of the aircraft 100 by rivets, bolts, or the like. The skin panel 1 may be for example part of a functional skin covering a part of or all of the fuselage or the wings of the aircraft 100. In this sense, a plurality of such skin panels 1 may be used to cover the entire fuselage or wing structure of the aircraft 100. However, in other applications, only a small number of skin panels 1 may be used in specific parts of the aircraft 100, while the other portions of the skin are formed from more conventional skin panels. For illustration purposes only, FIGS. 1a and 1b schematically depict specific embodiments of a skin panel 1 according to the disclosure herein. However, it will be clear to the person of skill that many other variants of the skin panel 1 may be envisaged that differ in shape or in layer configuration from the depicted examples. In principle, the embodiments of the skin panel 1, as they will be described in the following, may be used not only in aircraft, but also in general applications within the transport industry, e.g. in landborne, waterborne or airborne vehicles.

FIG. 1a depicts the basic configuration of a skin panel 1 according to one embodiment of the disclosure herein. The skin panel 1 comprises structural layers 2 for providing structural stability to the skin panel 1. One of the structural layers 2 forms an exterior supporting layer 2a of the skin panel 1. The other structural layer 2 forms an interior supporting layer 2b of the skin panel 1. Herein, exterior and interior are defined with respect to the inside of the aircraft. One or several primary functional layers 3 may be embedded between the exterior supporting layer 2a and the interior supporting layer 2b for providing functional capabilities to the skin panel 1. FIG. 1a depicts one single schematic primary functional layer 3 for illustration purposes. The structural layers 2a, 2b and the primary functional layers 3 are formed together as a composite laminate. The supporting layers 2a, 2b may be configured to provide load carrying capabilities, in particular they may be configured to carry tension and/or compression loads. At the same time, the primary functional layers 3 may be optimized to carry shear loads acting between the supporting layers 2a, 2b and the functional layers 3.

At least one of the exterior supporting layer 2a and the interior supporting layer 2b may be formed from a fiber reinforced composite material comprising carbon nanotube fibers embedded within a matrix material, e.g. epoxy resin. The carbon nanotube fibers may be particularly arranged in the form of a mesh, the mesh substantially covering the skin panel. The carbon nanotube fibers fulfill several purposes at the same time. On the one hand, they provide a high level of strength and stability while maintaining a very low general weight of the skin panel 1. On the other hand, carbon nanotube fibers are characterized by very high electrical conductivity. A mesh of such carbon nanotube fibers covering the skin panel 1 thus further may serve as a lightning protection and may replace conventional lightning protection layers for composite skins, e.g. made of copper mesh or similar material.

Referring now to FIG. 1b, various different primary functional layers 3, 3a, 3b, 3c, 3d are depicted that may be implemented into a skin panel 1 according to the disclosure herein, i.e. between the exterior supporting layer 2a and the interior supporting layer 2b, either all together in combination as shown in FIG. 1b or in different configurations with only one or several specific primary functional layers 3, 3a, 3b, 3c, 3d. Similarly, secondary functional layers 4, 4a, 4b are depicted, which are either placed outside of the exterior supporting layer 2a or inside the interior supporting layer 2b. However, in any case the primary functional layers 3 comprise an energy-storing layer 3a for providing electric energy to the skin panel and/or interior electric components of the aircraft 100. In this particular embodiment, the exterior supporting layer 2a is configured visually transparent, while the interior supporting layer 2b is formed from a visually opaque material. The exterior supporting layer 2a is covered by a thin, likewise transparent exterior secondary functional layer 4a, e.g. a transparent coating or similar. Directly beneath the exterior supporting layer 2a another structural layer 2 abuts the exterior supporting layer 2a. This additional structural layer 2 may be, for example, an isolating transparent layer electrically separating the exterior supporting layer 2a from the interior layers, the latter serving as a lightning protection.

The next lower layer is a primary functional layer 3 configured as an energy-harvesting layer 3b. The energy-harvesting layer 3b is configured as a photovoltaic module, which is able to generate electric energy based on light L being transmitted through the overlying visually transparent layers, i.e. the exterior secondary functional layer 4a, the exterior supporting layer 2a and the additional structural layer 2. The light L irradiates the energy-harvesting layer 3b, which in turn generates electric energy based on the incident light L.

As next lower layer, a primary functional layer 3 is configured as an energy-storing layer 3a abutting the energy-harvesting layer 3b from below. The energy-storing layer 3a is formed as a structural electro-chemical battery, in particular a lithium-ion battery, and is electrically connected to the energy-harvesting layer 3b via electrical pin connections 24 or other appropriate means such that the energy-harvesting layer 3b may charge the energy-storing layer 3a. For this purpose, the energy-storing layer 3a includes an anode layer 5 (not depicted, cf. FIGS. 2a and 2b) comprising carbon fibers embedded within an ion enriched matrix material and a cathode layer 6 comprising a metal fabric 15 substantially formed from copper mesh or the like embedded within the matrix material. The carbon fibers may be particularly embedded within a lithium-ion enriched epoxy resin. The manufacturing process of such anode layers 5 and cathode layers 6 is described in detail with respect to FIGS. 2a, 2b, 3 further below. The skin panel 1 hence provides an outer hull of the aircraft 100 that is suitable for use as a self-sustaining and rechargeable energy storing unit with high energy storing potential. Furthermore, this efficient energy source may be used to power electrically-operated functionalities (see the following description of further functional layers) within the skin panel 1 as well as within the aircraft 100, e.g. within a passenger cabin of the aircraft 100.

Still referring to FIG. 1b, the skin panel 1 comprises further primary functional layers 3. In addition to the energy-harvesting layer 3b and the energy-storing layer 3a, the skin panel 1 comprises an electric-actuator layer 3c configured to bend when exposed to an electric field, wherein the electric-actuator layer 3c is electrically powered by the energy-storing layer 3a and comprises an electro-active polymer layer 7 as well as a plurality of electrodes 8 configured to generate an electric field across the electro-active polymer layer 7. The electrodes 8 may be arranged as a cathode layer on one side and an anode layer on the other side of the electric-actuator layer 3c, each comprising a plurality of individual electrodes and/or an electrode grid or similar. The electric-actuator layer 3c may for example comprise an ionic polymer-metal composite layer or the like that bends when exposed to an electric field and thus may serve as an "artificial muscle" to realize active morphing structures, e.g. for actively adapting aircraft wings.

Furthermore, the primary functional layers 3 of the skin panel 1 comprise a structural-health-monitoring layer 3d including structural sensors 9 configured to monitor structural-health parameters P of the skin panel 1, wherein the structural sensors 9 are electrically powered by the energy-storing layer. The structural sensors 9 may comprise, for example, acceleration sensors or piezoelectric transducers, which may be distributed over the structural-health-monitoring layer 3d, and thus the skin panel 1, in a web-like configuration. When an object hits the aircraft 100 in the vicinity of one of such sensors, the respective sensor will detect the shock from the impact and may provide an estimation of the impact location, as well as possibly the affected area and/or the strength of the impact.

Still referring to FIG. 1b, the skin panel 1 further comprises an interior secondary functional layer 4b on the inside of the interior supporting layer 2b, which comprises further functional equipment that may also be powered by the energy-storing layer 3a. Such electrical equipment may comprise without limitation an electrical connector, an electronic display, an electronic interface and a computing device. For example, the electronic interfaces may be configured to provide access of a user to specific functions of the functional layers 3 for configuration, maintenance, or monitoring purposes. The electronic interface may connect the functional layers to electronic devices within the aircraft 100 or provided in or on the interior secondary functional layer 4b. For example, flexible displays, touchscreens or similar may be provided in or on the interior secondary functional layer 4b to display and process information for configuration and monitoring of specific functionalities of the functional layers 3 of the skin panel 1.

All primary and secondary functional layers 3a, 3b, 3c, 3d, 4a, 4b, as well as the inside of the aircraft 100 may in principle be connected to the energy-storing layer 3a via electrical pin connections 24, or other appropriate structure(s) like for example inter-laminar electronics or similar, such that the energy-storing layer 3a may provide the functional layers 3a, 3b, 3c, 3d, 4a, 4b as well as the aircraft 100 in general with electric energy. These kinds of electrical pin connections 24 may also be configured as data connections to transmit information between the skin panel 1 and the rest of the aircraft 100. Various configurations of the connections may be provided depending on the specific configuration of the skin panel 1 and the aircraft 100.

Figure 3:
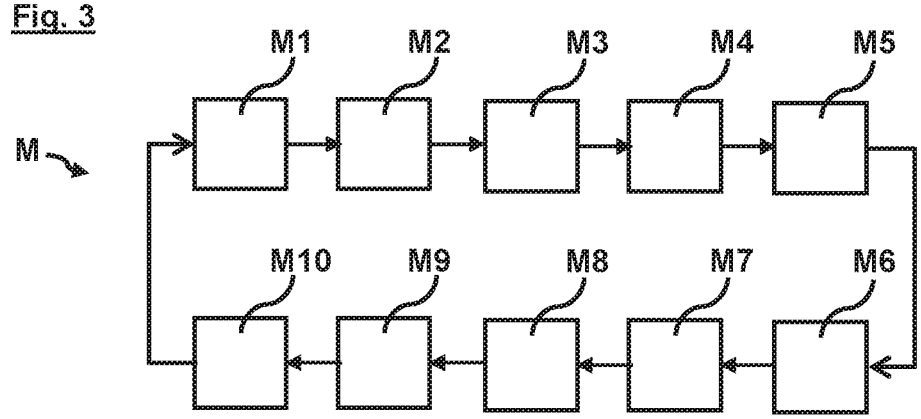
FIG. 3 shows a flow diagram of the method for manufacturing an energy-storing layer with the manufacturing device of FIGS. 2a and 2b.
Figure 2A:
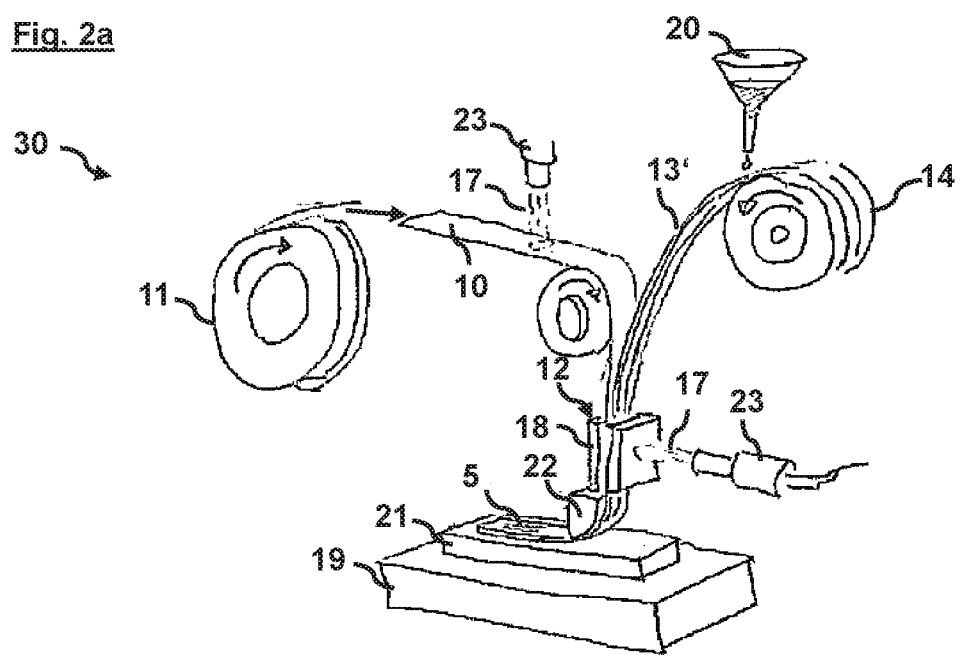
FIGS. 2a and 2b schematically illustrate a manufacturing device for implementing a method for manufacturing the energy-storing layer of FIGS. 1a and 1b according to an embodiment of the disclosure herein.
Figure 2B:
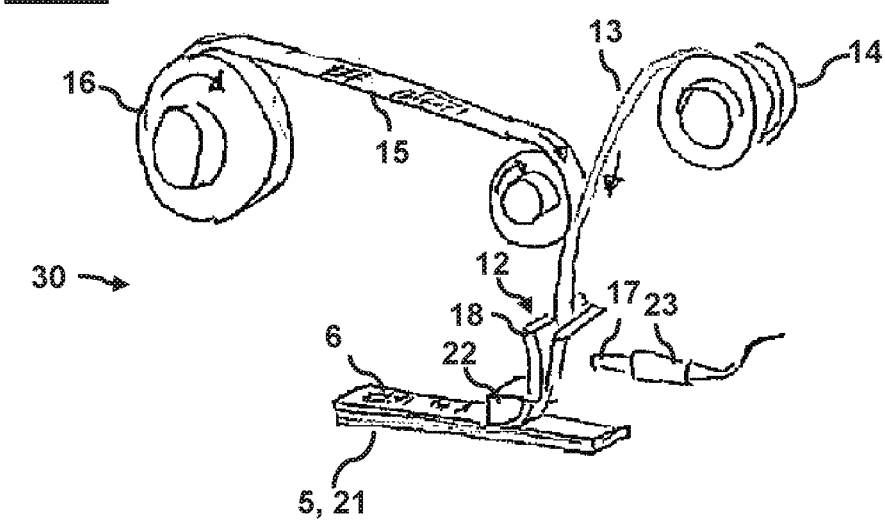

FIGS. 2a and 2b schematically illustrate a manufacturing device 30 for implementing a method M for manufacturing the energy-storing layer 3a of FIGS. 1a and 1b. FIG. 3 shows a flow diagram of the method M for manufacturing an energy-storing layer 3a with the manufacturing device 30 of FIGS. 2a and 2b.

Particularly referring to FIG. 2a and FIG. 3, the method M generally comprises under M1 supplying a spread tow tape 10 containing a plurality of reinforcing carbon fibers from a tape supply 11 to a merging station 12. Spread tow tapes 10 are fabricated by spreading tows of a dry fiber type, e.g. carbon fibers, carbon nanotube fibers or combinations thereof, into flat tapes of certain areal weight and width by using mechanical or electromagnetic spreading techniques. In addition, these tapes may be processed further by interlacing or interweaving the tapes to obtain a fabric with various orientations of fibers. Spread tow tapes 10 within the meaning of the disclosure herein generally comprise tapes of spread fiber tows and, thus, include unidirectional spread tows as well as spread tow fabrics from interlaced or interwoven spread tows. The spread tow tape 10 is provided in FIG. 2a from a tape supply 11, which is configured as a spool. The depicted variant of the printing device 30 with one spool is chosen for illustrative purposes only and the person of skill will readily acknowledge that many other variants may be advantageous depending on the specific application at hand. For example, one single spool may be sufficient for most applications, while other use cases may require a multitude of spools providing different types of spread tow tapes 10.

Still referring to FIGS. 2a and 3, the method M further comprises under M2 supplying a plurality of ion-enriched matrix-material filaments 13' from a multi-filament supply 14 to the merging station 12. The matrix material filaments 13' may be formed of an epoxy resin or a thermoplastic or another suitable meltable material. The multi-filament supply 14 is configured as a spool that provides a plurality of individual filaments. However, other variants may be provided in accordance with the principles of the present disclosure, which are based on different configurations. For example, the multi-filament supply 14 may not be configured as one single spool, but as an arrangement of a multitude of separate spools, possibly providing various different kinds of matrix materials.

The ion-enriched matrix-material filaments 13' are enriched with lithium-ions by application of a lithium ion-solvent 20. For this purpose, the spread tow tapes 10 are surface pretreated for ion reception with a laser surface treatment by a laser beam 17 transmitted onto the spread tow tapes 10 by a laser 23.

Still referring to FIGS. 2a and 3, the method M further comprises under M3 pressing together the plurality of ion-enriched matrix-material filaments 13' with the spread tow tape 10 at the merging station 12. The plurality of matrix material filaments 13' are pressed together with the spread tow tape 10 between two pressing plates 18.

Still referring to FIGS. 2a and 3, the method M further comprises under M4 heating the spread tow tape 10 together with the plurality of ion-enriched matrix-material filaments 13' at the merging station 12 to a melting temperature T of the ion-enriched matrix-material filaments 13' to form an anode layer 5 of the electro-chemical battery. The spread tow tape 10 is heated together with the plurality of matrix material filaments 13' by a laser beam 17. The laser beam 17 is transmitted on the spread tow tape 10 and the plurality of matrix material filaments 13' by passing through at least one of the two pressing plates 18. For this purpose, at least one of the pressing plates 18 is formed transparently to transmit the laser beam 17. In the embodiment of FIGS. 2a and 2b the right hand side pressing plate 18 may be particularly configured as a transparent plate, e.g. a glass plate, while the left hand side pressing plate 18 may be metal plate or the like. However, in principle both pressing plates 18 may be formed as glass plates, e.g. in an embodiment of the disclosure herein with more than one laser 23 at the merging station 12, for example with one laser on each side of the merging station 12.

Hence, by applying pressure and temperature on the matrix material filaments 13' and the spread tow tape 10 within the merging station 12, the individual filaments 13' are merged with the spread tow tape 10 to form an anode layer 5 of the structural electro-chemical battery of uncured, that is unconsolidated, matrix material, e.g. an epoxy resin, and carbon fibers. Still referring to FIG. 2, the method M further comprises under M5 depositing the anode layer 5 of the structural electro-chemical battery. The anode layer 5 is deposited by pressing down the anode layer 5 with an ironing device 22. The ironing device 22 may particularly be heated such that the matrix material within the anode layer 5 is kept in a molten or fluid condition, such that when the anode layer 5 is pressed against the print table 19 and the already composite layers 21 a smooth, unbroken buildup without any (unwanted) gaps, voids or cavities or the like is formed. Even though not shown in FIG. 2b, the manufacturing device 30 may provide a cutting device upstream of the ironing device 22, i.e. between the merging station 12 and the ironing device 22, which is configured to cut off the anode layer 5 above or at the ironing device 22. The deposited material may subsequently consolidate.

Now referring to FIGS. 2b and 3, a cathode layer 6 may be formed similarly as the anode layer 5 either before or after the anode layer 5 is formed. To this end, the method M includes under M6 supplying a metal fabric 15, e.g. comprising a copper mesh, from a fabric supply 16 to the merging station 12. The method M further includes under M7 supplying a plurality of matrix-material filaments 13 from the multi-filament supply 14 to the merging station 12. The method M further includes under M8 pressing together the plurality of matrix-material filaments 13 with the metal fabric 15 at the merging station 12. The method M further includes under M9 heating, again with a laser beam 17, the metal fabric 15 together with the plurality of matrix-material filaments 13 at the merging station 12 to a melting temperature T of the matrix-material filaments 13 to form a cathode layer 6 of the electro-chemical battery. The method M further includes under M10 depositing the cathode layer 6 of the structural electro-chemical battery.

Using the above-detailed method M multiple anode layers 5 and cathode layers 6 may be deposited on top of each such that a stacked layer configuration is achieved to form a multi-layer, multi-cell battery. To this end, method steps M1 to M5 and method steps M6 to M10, respectively, may be repeated as often as required. However, for some application it may be sufficient to provide one single anode layer 5 and one single cathode layer 6.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

The embodiments were chosen and described in order to best explain the principles of the disclosure herein and its practical applications, to thereby enable others skilled in the art to best utilize the disclosure herein and various embodiments with various modifications as are suited to the particular use contemplated. Many other examples will be apparent to one skilled in the art upon reviewing the above specification.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A skin panel with an energy-storing layer for an aircraft or spacecraft, the skin panel comprising:
   structural layers for providing structural stability to the skin panel, at least one of the structural layers forming an exterior supporting layer of the skin panel and at least one of the structural layers forming an interior supporting layer of the skin panel, wherein at least the exterior supporting layer of the structural layers comprises a fiber reinforced composite material;
   primary functional layers embedded between the exterior supporting layer and the interior supporting layer for providing functional capabilities to the skin panel; and
   one or more secondary functional layers, including an interior secondary functional layer abutting the interior supporting layer from inside;
   wherein the structural layers and the primary functional layers are formed together as a composite laminate;
   wherein the primary functional layers comprise the energy-storing layer, which is configured as a structural electro-chemical battery; and
   wherein the interior secondary functional layer comprises at least one of an electrical connector, an electronic display, an electronic interface, and a computing device, being electrically powered by the energy-storing layer.

2. The skin panel according to claim 1, wherein at least the exterior supporting layer is configured visually transparent and the primary functional layers comprise an energy-harvesting layer configured as a photovoltaic module, which is configured and arranged to generate electric energy based on light being transmitted through the exterior supporting layer onto the energy-harvesting layer and to charge the energy-storing layer with the generated electric energy.

3. The skin panel according to claim 1, wherein the primary functional layers comprise a structural-health-monitoring layer including structural sensors configured to monitor structural-health parameters of the skin panel, wherein the structural sensors are electrically powered by the energy-storing layer.

4. The skin panel according to claim 1, wherein the structural electro-chemical battery comprises a lithium-ion battery.

5. The skin panel according to claim 1, wherein the energy-storing layer includes an anode layer comprising carbon fibers embedded within an ion enriched matrix material and a cathode layer comprising a metal fabric embedded within the matrix material.

6. The skin panel according to claim 5, wherein the carbon fibers are embedded within a lithium-ion enriched matrix material, wherein the metal fabric comprises a copper mesh, and wherein the matrix material comprises an epoxy resin.

7. The skin panel according to claim 1, wherein the primary functional layers comprise an electric-actuator layer configured to bend when exposed to an electric field, wherein the electric-actuator layer is electrically powered by the energy- storing layer.

8. The skin panel according to claim 7, wherein the electric-actuator layer comprises an electro-active polymer layer and a plurality of electrodes configured to generate an electric field across the electro-active polymer layer.

9. The skin panel according to claim 1, wherein the fiber reinforced composite material of the exterior supporting layer comprises carbon nanotube fibers embedded within a matrix material.

10. The skin panel according to claim 9, wherein the carbon nanotube fibers are arranged in a form of a mesh, the mesh substantially covering the skin panel.

11. The skin panel according to claim 1, wherein the one or more secondary functional layers includes an exterior secondary functional layer abutting the exterior supporting layer from outside.

12. The skin panel according to claim 11, wherein the exterior secondary functional layer is configured as a protection layer for protecting the skin panel.

13. The skin panel according to claim 1, wherein the interior supporting layer comprises the fiber reinforced composite material.

14. The skin panel according to claim 13, wherein the fiber reinforced composite material of the exterior supporting layer and the interior supporting layer comprises carbon nanotube fibers embedded within a matrix material.

15. The skin panel according to claim 13, wherein the carbon nanotube fibers are arranged in a form of a mesh, the mesh substantially covering the skin panel.

16. An aircraft or spacecraft comprising a functional skin with a plurality of skin panels, each skin panel having an energy-storing layer, and each skin panel comprising:
   structural layers for providing structural stability to the skin panel, at least one of the structural layers forming an exterior supporting layer of the skin panel and at least one of the structural layers forming an interior supporting layer of the skin panel, wherein at least the exterior supporting layer of the structural layers comprises a fiber reinforced composite material;
   primary functional layers embedded between the exterior supporting layer and the interior supporting layer for providing functional capabilities to the skin panel; and
   one or more secondary functional layers, including an interior secondary functional layer abutting the interior supporting layer from inside;
   wherein the structural layers and the primary functional layers are formed together as a composite laminate;
   wherein the primary functional layers comprise the energy-storing layer, which is configured as a structural electro-chemical battery; and
   wherein the interior secondary functional layer comprises at least one of an electrical connector, an electronic display, an electronic interface and a computing device, being electrically powered by the energy-storing layer.

17. The aircraft or spacecraft according to claim 16, wherein the structural electro-chemical battery comprises a lithium-ion battery.

* * * * *